United States Patent
Lu et al.

(10) Patent No.: US 10,446,410 B2
(45) Date of Patent: Oct. 15, 2019

(54) METHOD OF PROCESSING SURFACE OF POLYSILICON AND METHOD OF PROCESSING SURFACE OF SUBSTRATE ASSEMBLY

(71) Applicant: BOE TECHNOLOGY GROUP CO., LTD., Beijing (CN)

(72) Inventors: Xiaoyong Lu, Beijing (CN); Chunping Long, Beijing (CN); Chien Hung Liu, Beijing (CN); Yucheng Chan, Beijing (CN); Xiaolong Li, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,537

(22) PCT Filed: Mar. 7, 2016

(86) PCT No.: PCT/CN2016/075783
§ 371 (c)(1),
(2) Date: Dec. 22, 2016

(87) PCT Pub. No.: WO2017/049881
PCT Pub. Date: Mar. 30, 2017

(65) Prior Publication Data
US 2017/0271171 A1 Sep. 21, 2017

(30) Foreign Application Priority Data
Sep. 21, 2015 (CN) .......................... 2015 1 0604497

(51) Int. Cl.
*H01L 21/321* (2006.01)
*H01L 21/306* (2006.01)
(Continued)

(52) U.S. Cl.
CPC ...... *H01L 21/3212* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS 5,937,275 A * 8/1999 Munzel ............... G01P 15/0802
438/50
6,391,067 B2 * 5/2002 Yanagita ........... H01L 21/02052
257/E21.122
(Continued)

FOREIGN PATENT DOCUMENTS

CN 101492592 A 7/2009
CN 101578230 A 11/2009
(Continued)

OTHER PUBLICATIONS

International Search Report and Written Opinion (including English translation of Box V) dated Jun. 29, 2016, for corresponding PCT Application No. PCT/CN2016/075783.
(Continued)

*Primary Examiner* — Stephanie P Duclair
(74) *Attorney, Agent, or Firm* — Kinney & Lange, P.A.

(57) ABSTRACT

Embodiments of the present invention provide a method of processing a surface of a polysilicon and a method of processing a surface of a substrate assembly. The method of processing a surface of a polysilicon includes forming a material film on the surface of the polysilicon; and processing, by using a chemico-mechanical polishing technology, the surface of the polysilicon on which the material film is formed. The material film is selected such that the polysilicon is preferentially removed in a polishing process.

14 Claims, 4 Drawing Sheets

(51) Int. Cl.
*H01L 21/768* (2006.01)
*H01L 21/3105* (2006.01)
*H01L 21/3213* (2006.01)
*H01L 21/02* (2006.01)
*H01L 21/48* (2006.01)

(52) U.S. Cl.
CPC .. *H01L 21/02274* (2013.01); *H01L 21/30625* (2013.01); *H01L 21/31051* (2013.01); *H01L 21/31053* (2013.01); *H01L 21/32115* (2013.01); *H01L 21/32134* (2013.01); *H01L 21/32139* (2013.01); *H01L 21/48* (2013.01); *H01L 21/7684* (2013.01); *B81C 2201/0121* (2013.01)

(56) References Cited

U.S. PATENT DOCUMENTS

| | | | |
|---|---|---|---|
| 6,498,106 B1 * | 12/2002 | Hsin | G03F 7/40 252/79.1 |
| 6,559,040 B1 * | 5/2003 | Yu | H01L 21/28035 257/E21.197 |
| 6,740,588 B1 * | 5/2004 | Koutny, Jr. | H01L 21/3212 257/E21.304 |
| 7,271,100 B2 | 9/2007 | Lee et al. | |
| 2001/0024879 A1 | 9/2001 | Kim et al. | |
| 2012/0258596 A1 * | 10/2012 | Busch | H01L 21/3212 438/692 |
| 2014/0162455 A1 | 6/2014 | Carswell et al. | |

FOREIGN PATENT DOCUMENTS

| | | |
|---|---|---|
| CN | 102412140 A | 4/2012 |
| CN | 102737978 A | 10/2012 |
| CN | 105161413 A | 12/2015 |

OTHER PUBLICATIONS

First Chinese Office Action, for Chinese Patent Application No. 201510604497.2, dated Jun. 14, 2017, 13 pages.
Second Chinese Office Action, for Chinese Patent Application No. 201510604497.2, dated Dec. 4, 2017.

* cited by examiner

METHOD OF PROCESSING SURFACE OF POLYSILICON AND METHOD OF PROCESSING SURFACE OF SUBSTRATE ASSEMBLY

This application is a Section 371 National Stage Application of International Application No. PCT/CN2016/075783, filed on Mar. 7, 2016, entitled "METHOD OF PROCESSING SURFACE OF POLYSILICON AND METHOD OF PROCESSING SURFACE OF SUBSTRATE ASSEMBLY", which has not yet published, which claims priority to Chinese Application No. 201510604497.2, filed on Sep. 21, 2015, incorporated herein by reference in their entirety.

BACKGROUND

1. Technical Field

Embodiments of the present invention relate to the field of semiconductor surface processing, and particularly to a method of processing a surface of a polysilicon and a method of processing a surface of a substrate assembly.

2. Description of the Related Art

A rough part of a surface of a polysilicon formed by a current low-temperature polysilicon thin film technology exists mainly at a boundary where grains join, i.e. at a grain boundary. A mechanism of forming the rough surface can result from a difference between densities of a melted silicon and a solid silicon. A solidification process begins at a nucleation center and what is last solidified is at the grain boundary where the melted silicon and the solid silicon exist simultaneously. After a process of forming the grains is finished, a protrusion is formed at the grain boundary.

FIG. 1 shows a surface of a polysilicon formed by a typical low-temperature polysilicon technology. The surface has a roughness of up to 9 nm.

SUMMARY

Embodiments of the present invention provide a method of processing a surface of a polysilicon, and the method comprises: forming a material film on the surface of the polysilicon; and processing, by using a chemico-mechanical polishing technology, the surface of the polysilicon on which the material film is formed, wherein the material film is selected such that the polysilicon is preferentially removed in a polishing process.

Embodiments of the present invention provide a method of processing a surface of a substrate assembly, the substrate assembly comprising a polysilicon region and a non-polysilicon region, and the method comprises: forming, on a surface of the substrate assembly, a masking film to cover the non-polysilicon region; and processing the polysilicon region by using the abovementioned method.

DETAILED DESCRIPTION OF THE EMBODIMENTS

A further description of the invention will be made in detail as below with reference to embodiments of the present invention taken in conjunction with the accompanying drawings. The following embodiments are intended to explain the present invention and the present invention should not be construed as being limited to the embodiment set forth herein.

Figure 5:
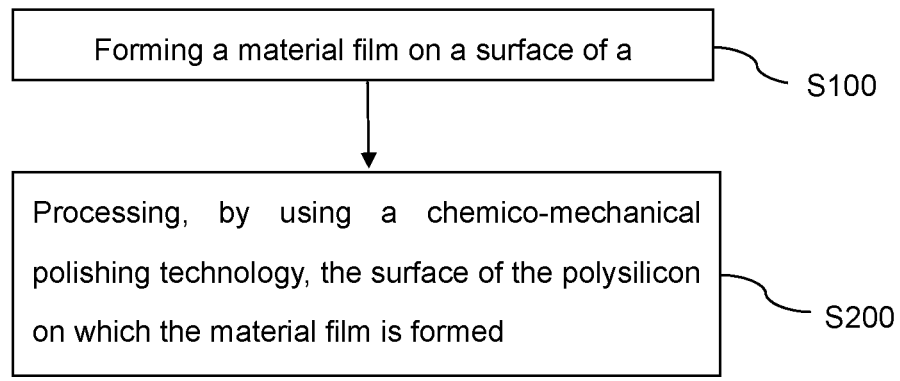
FIG. 5 shows a flow diagram of a method according to an embodiment of the present invention.

In accordance with a first embodiment of the present invention, a method of processing a surface of a polysilicon (P—Si) is provided. As shown in FIG. 5, the method comprises: forming a material film on the surface of the polysilicon (S100); and processing, by using a chemico-mechanical polishing technology, the surface of the polysilicon on which the material film is formed (S200). The material film is selected such that the polysilicon is preferentially removed in a polishing process.

In an embodiment of the present invention, the method comprises processing the surface of the polysilicon by using the chemico-mechanical polishing technology. While the surface of the polysilicon is polished, for example an alkaline polishing fluid of silicon dioxide may be used. In the polishing process, a chemical reaction takes place. The equation of the chemical reaction is $Si+H_2O+2OH^- \Rightarrow \Rightarrow SiO_3^{2-}+2H_2$. With the method according to the embodiments of the present invention, a soluble silicate is produced by means of a chemical corrosion reaction between alkali and silicon. Then, a reaction product is removed in time, by means of an adsorption effect of colloidal particles of $SiO_2$ which are fine and soft, have a large specific surface area, and carry negative charges, and by means of mechanical friction effects between the colloidal particles and a polishing pad and between the colloidal particles and the surface of the polysilicon, thereby removing a part of silicon Si of a protrusion of the surface.

Figure 3:
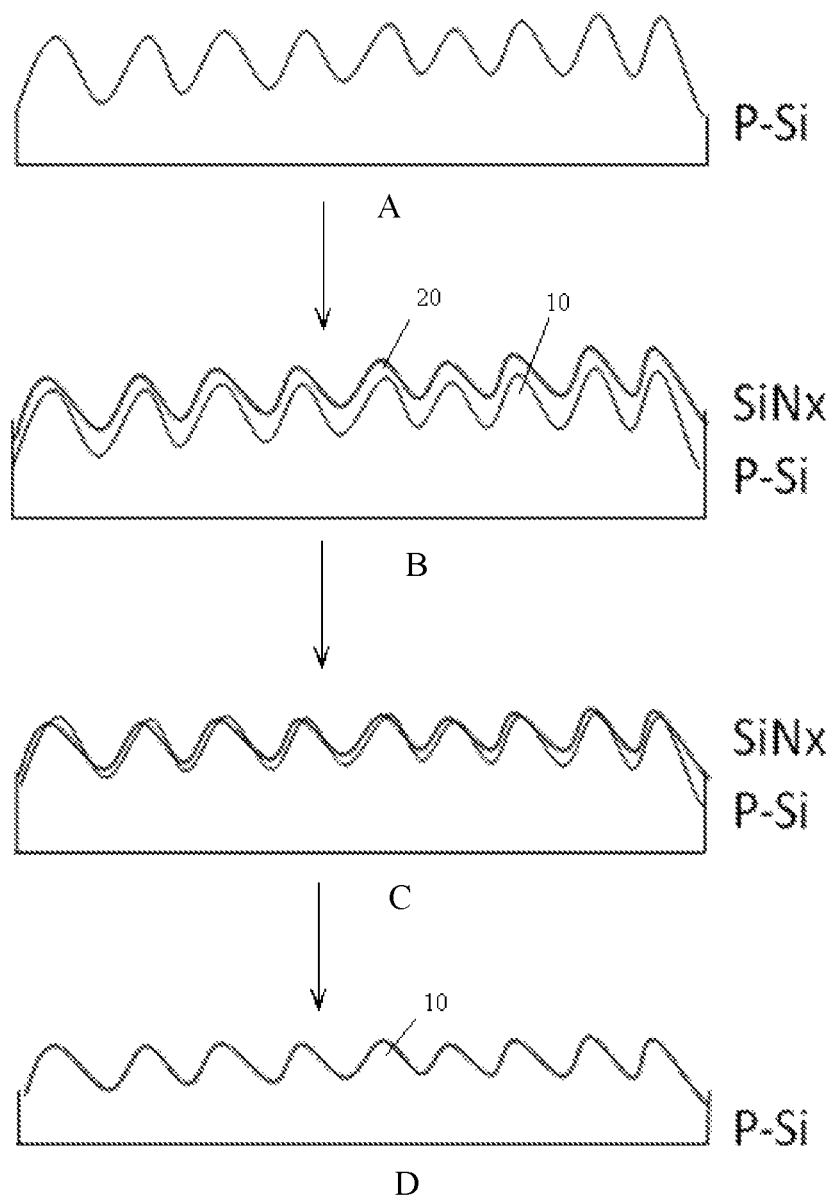
FIG. 3 shows a flow of processing the surface of the polysilicon by using the method according to the embodiment of the present invention.

In an embodiment of the present invention, the method comprises depositing a SiNx film on the surface of the polysilicon prior to the processing the surface of the polysilicon by using the chemico-mechanical polishing technology. For example, the SiNx film deposited on the surface of the polysilicon has a thickness of about 80~120 angstroms, for example 90~110 angstroms, or 100 angstroms. Optionally, a chemical vapor deposition (CVD) method may be selected for depositing the SiNx film. FIG. 3 shows a polysilicon P—Si (FIG. A), the polysilicon P—Si covered with a SiNx film (FIG. B), the polysilicon P—Si with the SiNx film being partially removed (FIG. C), and the polysilicon P—Si which is finally polished (FIG. D). A plasma-enhanced chemical vapor deposition (PECVD) method may be used for depositing the SiNx film. It should be understood by those skilled in the art that, the SiNx film may be formed on the surface of the polysilicon by using other well-known film depositing or epitaxial methods. The plasma-enhanced chemical vapor deposition (PECVD) method is used because it is relatively good in efficiency and cost control.

In an embodiment of the present invention, the process of the processing, by using the chemico-mechanical polishing technology, the surface of the polysilicon on which the material film is formed or deposited comprises a first stage in which the material film is removed and a second stage in which the material film and the polysilicon are removed simultaneously. In the second stage, the polysilicon is preferentially removed, or the polysilicon is more preferentially removed than the material film. It should be understood that, introduction of the two stages is for facilitating description only.

Figure 4:
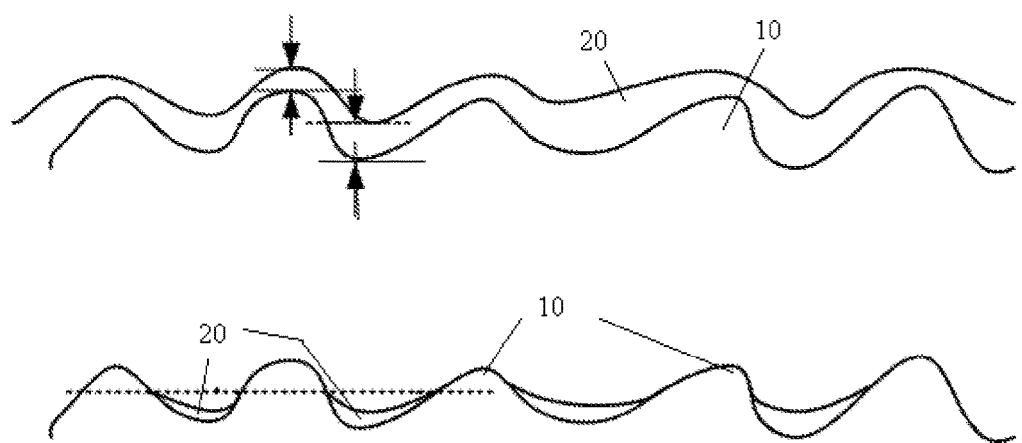
FIG. 4 shows forms of the surface of the polysilicon, on which a material film is formed, in a polishing process.

FIG. 4 shows forms of the surface of the polysilicon 10, on which a material film 20 (for example SiNx) is deposited, in a polishing process in more detail. In the upper figure of FIG. 4, the polysilicon 10 as a lower layer is covered with SiNx 20 (as shown in FIG. 4), and at the moment, SiNx 20 has not been removed by polishing. Since the upper surface of the polysilicon 10 is rough (roughness of the surface of the polysilicon 10 is enlarged in the figures), the SiNx 20 has a relatively great thickness at recesses of the surface of the polysilicon 10, while the SiNx 20 has a relatively small thickness at protrusions of the surface of the polysilicon 10. As a chemico-mechanical polishing is being performed, the SiNx 20 is continuously thinned, a part of the surface of the polysilicon 10 is exposed (as shown in the lower figure of FIG. 4). In this case, the SiNx and the part of surface of the polysilicon are simultaneously exposed to a chemico-mechanical polishing fluid and are simultaneously subjected to a mechanical polishing. Since the chemico-mechanical polishing fluid has a stronger ability of etching the polysilicon, the polysilicon is preferentially etched to be removed, so that protrusion parts of the rough surface of the polysilicon are polished. In this embodiment, an alkaline polishing fluid of silicon dioxide is adopted for the chemico-mechanical polishing technology.

In an embodiment of the present invention, the method comprises depositing a SiOx film on the surface of the polysilicon prior to the processing the surface of the polysilicon by using the chemico-mechanical polishing technology. For example, the SiOx film deposited on the surface of the polysilicon has a thickness of about 800~120 angstroms, or of about 90~110 angstroms. Optionally, SiOx may be formed on the polysilicon by an oxidation method. This method is convenient and is mature in technology, and an oxidation processing may be achieved by adjusting a temperature and a time during drying, facilitating a technological design. Optionally, a chemical vapor deposition (CVD) method may be selected for depositing the SiOx film. For example, a plasma-enhanced chemical vapor deposition (PECVD) method is used for depositing the SiOx film. It should be understood by those skilled in the art that, the SiOx film may be formed on the surface of the polysilicon by using other well-known film depositing or epitaxial methods. The plasma-enhanced chemical vapor deposition (PECVD) method is used because it is relatively good in efficiency and cost control.

A process of a chemico-mechanical polishing using the SiOx film is similar to that of the chemico-mechanical polishing using the SiNx film 20, and the specific process is no longer described for the sake of brevity.

In other embodiments of the present invention, any other compound of silicon or even any other material may be formed on the polysilicon P~Si 10 so long as the polysilicon is processed with the polishing fluid, at a greater rate than the material when the polysilicon is polished by using the polishing fluid. During the polishing with the polishing fluid, an effect of etching the polysilicon by the polishing fluid is different from an effect of etching the material covering the polysilicon by the polishing fluid. When the material covering the polysilicon is partially removed, a part of the polysilicon is exposed. In other words, in this case, the polysilicon 10 and the material covering the polysilicon are simultaneously exposed. The polysilicon 10 will be removed more quickly and finally the material covering the polysilicon is also removed. The polishing is stopped. Thereby, the roughness of the surface of the polysilicon 10 is reduced.

According to the method of the embodiments of the present invention, the surface of the polysilicon may be preprocessed. In other words, prior to the deposition or formation of for example the SiNx film 20, the surface of the polysilicon 10 is cleaned. The surface of the polysilicon may be cleaned by using a deionized water or an organic solvent. For example, the surface of the polysilicon is cleaned by spraying the deionized water or the organic solvent.

The method according to an embodiment of the present invention comprises: depositing a material film, for example a SiNx film, on the surface of the polysilicon, and then, polishing the surface of the polysilicon 10 on which the material film 20, for example the SiNx film is deposited. In FIG. 3, the polished polysilicon P~Si 10 covered with the material film, for example the SiNx film as shown in FIG. C is obtained by polishing the polysilicon 10 covered with the material film 20, for example the SiNx film. In an embodiment according to the present invention, in the method, the surface of the polysilicon is processed by chemico-mechanical grinding, i.e., a chemico-mechanical grinding method, and an alkaline polysilicon grinding fluid is used while the surface of the polysilicon is processed. In the polishing process, referring especially to FIG. 4, the SiNx 20 and a part of the polysilicon 10 are simultaneously exposed to the polishing fluid. The SiNx 20 and the part of the polysilicon 10 chemically react with the polishing fluid. The equation of the chemical reaction is $Si+H_2O+2OH^- => SiO_3^{2-}+2H_2$. With the method according to the embodiments of the present invention, a soluble silicate is produced by means of a chemical corrosion reaction between alkali and silicon. Then, a reaction product is removed in time by means of an adsorption effect of colloidal particles of $SiO_2$ which are fine and soft, have a large specific surface area, and carry negative charges, and by means of mechanical friction effects between the colloidal particles and a polishing pad and between the colloidal particles and the surface of the polysilicon, thereby removing SiNx and a part of silicon at a protrusion of the surface. As shown in the figure, the processed polysilicon P—Si shown in FIG. D of FIG. 3 is obtained. In an embodiment, an alkaline polishing fluid of silicon dioxide for chemico-mechanical polishing may consist of a grinding agent having superfine solid particles (such as nanoparticles of $SiO_2$, $Al_2O_3$ and the like), a surfactant, a stabilizer, an oxidizing agent and the like. The solid particles provide a grinding effect, and the chemical oxidizing agent provides a corrosion and dissolution effect. A grinding rate is for example 30~100 A/min, while a grinding time is for example 20 s~60 s. In other embodiments of the present invention, any other combinations of the grinding agent, the grinding time, and the grinding rate may be used.

The method according to an embodiment of the present invention may further comprise wet-etching the surface of the polysilicon by using an etching solution. The SiNx on the surface can be removed by wet-etching the surface of the polysilicon by using the etching solution. Particles produced in a process of the chemico-mechanical grinding processing but remaining on the surface of the photoresist can also be removed by wet-etching the surface of the polysilicon by using the etching solution.

It is advantageous to wet-etch the SiNx 20 or SiOx by using the etching solution since it does not need a vacuum to perform the wet-etching. Therefore, the technology of the wet-etching is easily achieved and it is relatively cheap and has a relatively low cost to use the etching solution.

Figure 1:
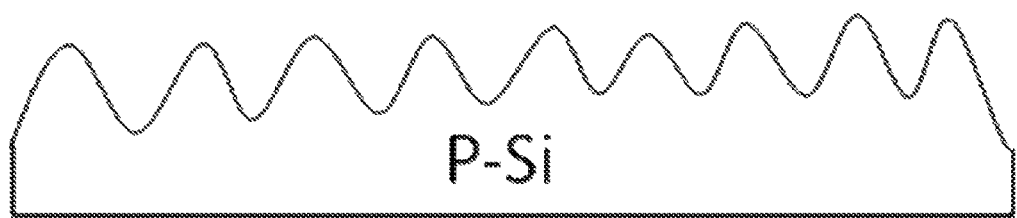
FIG. 1 shows a surface of a polysilicon formed by a common low-temperature polysilicon technology, the surface having a roughness of up to 9 nm.
Figure 2:
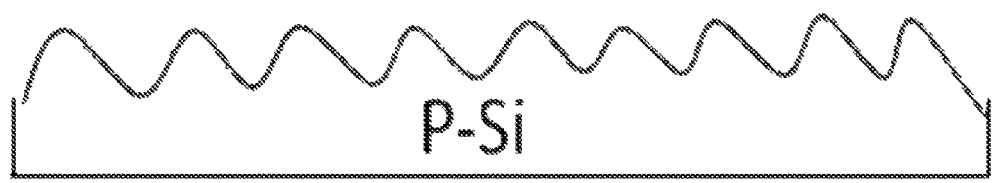
FIG. 2 shows a surface of a polysilicon processed by using a method according to an embodiment of the present invention, a roughness of the surface being decreased to 6 nm or less.

Therefore, by processing the polysilicon by using the method according to the embodiments of the present invention, a roughness of the processed surface of the polysilicon can reach a level of less than 6 nm, and is greatly reduced compared with a roughness of a surface of a polysilicon processed by means of a conventional technology. FIG. 2 shows the surface of the polysilicon processed by using the method according to the embodiments of the present invention.

Further, in an embodiment of the present invention, in a step of removing a film material deposited on the surface by wet-etching the material film, for example SiNx, a vibration of a supersonic wave is used to provide energy through the supersonic wave, thereby speeding up peeling of a surficial compound.

Furthermore, the supersonic wave has a frequency in the range of 50 kHz to 120 kHz. The supersonic wave of super high frequency has little damage to the polysilicon, and is suitable for manufacturing a semiconductor device.

In the embodiments of the present invention, it is advantageous to deposit a material film, for example a SiNx film, on the surface of the polysilicon prior to the polishing the surface of the polysilicon. Because of the deposited material film, for example the SiNx film 20, a selectivity raito of grinding the polysilicon 10 with the alkaline polysilicon polishing fluid is greater than that of grinding a material, for example in the SiNx 20 or the material film, with the alkaline polysilicon polishing fluid, facilitating grinding of polysilicon 10 of the protrusions of the surface. It is to be noted that, in the chemico-mechanical polishing technology, the polishing fluid may be selected according to the material film and the polysilicon 10 to satisfy a suitable selectivity ratio so long as the polysilicon 10 is preferentially etched.

In an embodiment of the present invention, a polysilicon in the substrate assembly formed with devices may be processed. Prior to processing a surface of the polysilicon, a region of the substrate assembly excepting the polysilicon is covered with a masking film. The masking film is selected such that, the mast cannot be removed in subsequent polishing and wet-etching processes, so that the processing of the polysilicon will not affect the other devices or parts in the substrate assembly.

After a roughness of the surface of the polysilicon reaches a predetermined requirement, the masking film is removed by means of a corresponding suitable wet-etching method.

In the description of the present disclosure, the surface of the polysilicon may indicate a polysilicon without any other material or film, or indicate a processed surface of the polysilicon or a surface of the polysilicon on which a film has been deposited.

According to the embodiments of the present invention, there is provided a manufacturing method which improves performance of low-temperature polysilicon thin film transistors. By corroding and grinding the protrusions of the surface of the polysilicon by means of the chemico-mechanical grinding technology, a roughness of the surface of the polysilicon can be effectively reduced, interface defects are decreased, and performance of a low-temperature polysilicon substrate assembly is improved, thereby obtaining relatively stable property of the thin film transistors.

The above embodiments are only used to explain the present invention, and should not be construed to limit the present invention. It will be understood by those skilled in the art that various changes and modifications may be made therein without departing from the scope of the present invention. Therefore, all of the equivalent technical solutions also belong to the scope of the present invention. The scope of the present invention is defined in the appended claims.

What is claimed is:

1. A method of processing a surface of a polysilicon, the method comprising:
    forming a material film on the surface of the polysilicon, wherein the surface of the polysilicon has a roughness formed by a plurality of irregular protrusions and recesses; and
    processing the surface of the polysilicon on which the material film is formed, wherein processing comprises using a chemico-mechanical polishing technology,
    wherein the material film is selected such that the polysilicon is removed preferentially to the material film in a polishing process to decrease a roughness of the surface of the polysilicon;
    wherein the step of processing the surface of the polysilicon comprises a first stage in which the material film is removed and a second stage in which the material film and the polysilicon are removed simultaneously, wherein in the second stage, the polysilicon is removed preferentially to the material film so that top portions of some of the plurality of irregular protrusions are removed while bottoms of some of the plurality of irregular recesses remain covered with the material film and are retained unchanged; and
    wherein after processing the surface of the polysilicon, the surface of the polysilicon is wet-etched with an etching solution, wherein a remaining portion of the material film formed on the surface of the polysilicon is removed by wet-etching; and
    wherein some of the plurality of irregular protrusions and some of the plurality of irregular recesses are retained, and heights of some of the plurality of irregular protrusions are reduced.

2. The method of claim 1, wherein:
the forming the material film on the surface of the polysilicon comprises depositing the material film on the surface of the polysilicon.

3. The method of claim 2, wherein:
the material film comprises a SiNx film.

4. The method of claim 3, wherein:
the SiNx film deposited on the surface of the polysilicon has a thickness in a range of 80-120 angstroms.

5. The method of claim 4, wherein:
the SiNx film deposited on the surface of the polysilicon has a thickness of 100 angstroms.

6. The method of claim 3, wherein:
the SiNx film is deposited by using a plasma-enhanced chemical vapor deposition (PECVD) method.

7. The method of claim 1, wherein:
the surface of the polysilicon on which the material film is formed is processed by using the chemico-mechanical polishing technology in which an alkaline polishing fluid of silicon dioxide is adopted.

8. The method of claim 1, wherein:
the material film comprises a SiOx film.

9. The method of claim 8, wherein:
the SiOx film is formed by using an oxidation method or the SiOx film is deposited by using a plasma-enhanced chemical vapor deposition (PECVD) method.

10. The method of claim 1, wherein:
while the surface of the polysilicon is wet-etched with the etching solution, a vibration of a supersonic wave having a frequency in a range of 50 kHz to 120 kHz is applied.

11. The method of claim 1, further comprising:
a preprocessing step of cleaning the surface of the polysilicon prior to forming the material film.

12. The method of claim 1, wherein the material film on the surface of the polysilicon is characterized by a greater thickness at the plurality of recesses than at the plurality of protrusions.

13. A method of processing a surface of a substrate assembly, the substrate assembly comprising a polysilicon region and a non-polysilicon region, the method comprising:
forming, on a surface of the substrate assembly, a masking film to cover the non-polysilicon region; and
processing the polysilicon region by using the method of claim 1.

14. The method of claim 13, further comprising:
removing the masking film formed on the surface of the substrate assembly.

* * * * *